(12) United States Patent
Chen

(10) Patent No.: US 11,348,994 B2
(45) Date of Patent: May 31, 2022

(54) FINGERPRINT SENSORS

(71) Applicants: Semiconductor Manufacturing International (Shanghai) Corporation, Shanghai (CN); Semiconductor Manufacturing International (Beijing) Corporation, Beijing (CN)

(72) Inventor: Fu Gang Chen, Shanghai (CN)

(73) Assignees: Semiconductor Manufacturing International (Shanghai) Corporation, Shanghai (CN); Semiconductor Manufacturing International (Beijing) Corporation, Beijing (CN)

(\*) Notice: Subject to any disclaimer, the term of this patent is extended or adjusted under 35 U.S.C. 154(b) by 302 days.

(21) Appl. No.: 16/782,200

(22) Filed: Feb. 5, 2020

(65) Prior Publication Data

US 2020/0185491 A1 Jun. 11, 2020

Related U.S. Application Data

(62) Division of application No. 16/044,373, filed on Jul. 24, 2018, now Pat. No. 10,600,861.

(30) Foreign Application Priority Data

Jul. 25, 2017 (CN) .......................... 201710611417.5

(51) Int. Cl.
*H01L 49/02* (2006.01)
*H01L 23/522* (2006.01)
(Continued)

(52) U.S. Cl.
CPC .......... *H01L 28/84* (2013.01); *G06V 40/1306* (2022.01); *H01L 23/5223* (2013.01); *H01L 27/0629* (2013.01)

(58) Field of Classification Search
CPC ....... H01L 49/02; H01L 27/06; H01L 23/522; H01L 28/84; H01L 23/5223; H01L 27/0629; G06K 9/00; G06K 9/0002
(Continued)

(56) References Cited

U.S. PATENT DOCUMENTS

2008/0277760 A1 11/2008 Kohler et al.
2018/0069068 A1\* 3/2018 Ka ..................... H01L 27/1225
(Continued)

FOREIGN PATENT DOCUMENTS

CN 101740472 A 6/2010
CN 104051477 A 9/2014
(Continued)

*Primary Examiner* — Alexander O Williams
(74) *Attorney, Agent, or Firm* — Anova Law Group, PLLC

(57) ABSTRACT

A fingerprint sensor includes: a base substrate including a plurality of pixel regions; a sensing dielectric structure formed on the base substrate in the pixel regions; and a sensing connection structure formed in the sensing dielectric structure. The sensing dielectric structure exposes the sensing connection structure and the sensing connection structure is connected to the base substrate. The fingerprint sensor further includes a plurality of electrode plates formed on surfaces of the sensing dielectric structure and the sensing connection structure. A plurality of protrusions are formed on surfaces of the electrode plates. The fingerprint sensor further includes an insulation medium structure formed on the plurality of electrode plates.

11 Claims, 5 Drawing Sheets

(51) Int. Cl.
*H01L 27/06* (2006.01)
*G06V 40/13* (2022.01)

(58) Field of Classification Search
USPC .......................................................... 257/534
See application file for complete search history.

(56) References Cited

U.S. PATENT DOCUMENTS

2018/0122904 A1    5/2018  Matsumoto et al.
2021/0408170 A1*  12/2021  Li ........................ H01L 27/3276

FOREIGN PATENT DOCUMENTS

| CN | 104866834 A |   | 8/2015 |
|----|-------------|---|--------|
| CN | 105138988 A |   | 12/2015 |
| CN | 106302871 A |   | 1/2017 |
| CN | 109034089 A | * | 12/2018 |

* cited by examiner

FINGERPRINT SENSORS

CROSS-REFERENCES TO RELATED APPLICATIONS

This application is a divisional of U.S. patent application Ser. No. 16/044,373, filed on Jul. 24, 2018, which claims the priority of Chinese Patent Application No. CN201710611417.5, filed on Jul. 25, 2017, the entire content of which is incorporated herein by reference.

FIELD OF THE DISCLOSURE

The present disclosure generally relates to the field of semiconductor fabrication technology and, more particularly, relates to fingerprint sensors and fabrication methods thereof.

BACKGROUND

Fingerprint sensors are key devices for automatic fingerprint acquisition. According to the principle of sensing, that is, the principle for fingerprint imaging, fingerprint sensors include optical fingerprint sensors, semiconductor capacitive sensors, semiconductor thermal sensors, ultrasonic sensors, and radio-frequency (RF) sensors, etc. The manufacturing for fingerprint sensors is comprehensive, and highly complicated and difficult.

The semiconductor capacitive sensors mainly utilize capacitors to acquire fingerprints. The semiconductor capacitive sensors demonstrate advantages including low price, small volume, high recognition rate, etc. and are commonly used in mobile phones, computers, cars, and home security identification systems.

In a semiconductor capacitive sensor includes a "plate" integrated with thousands of semiconductor devices, and a finger touching the "plate" may serve as an electrode of the capacitors. Because of the ridges and the valleys of the finger surface, the actual distances for the finger to make contact with the "plate" may be different at the ridge positions as compared to at the valley positions, resulting in different capacitance values at different positions of the fingerprint. The data at different positions are then collected to complete the acquisition of the fingerprint.

However, the sensitivity of the existing semiconductor fingerprint sensors still needs to be improved. The disclosed fingerprint sensors and fabrication methods thereof are directed to solve one or more problems set forth above and other problems in the art.

BRIEF SUMMARY OF THE DISCLOSURE

One aspect of the present disclosure provides a method for fabricating a fingerprint sensor. The method includes providing a base substrate including a plurality of pixel regions, forming a sensing dielectric structure on the base substrate in the plurality of pixel regions, and forming a sensing connection structure in the sensing dielectric structure. The sensing dielectric structure exposes the sensing connection structure, and the sensing connection structure is connected to the base substrate. The method also includes forming a plurality of electrode plates on surfaces of the sensing dielectric structure and the sensing connection structure, forming a plurality of protrusions on surfaces of the electrode plates by performing a bulging treatment process on the plurality of electrode plates, and forming an insulation medium structure on the plurality of electrode plates.

Another aspect of the present disclosure provides a fingerprint sensor. The fingerprint sensor includes a base substrate including a plurality of pixel regions, a sensing dielectric structure formed on the base substrate in the pixel regions, and a sensing connection structure formed in the sensing dielectric structure. The sensing dielectric structure exposes the sensing connection structure, and the sensing connection structure is connected to the base substrate. The fingerprint sensor also includes a plurality of electrode plates formed on surfaces of the sensing dielectric structure and the sensing connection structure, and an insulation medium structure formed on the plurality of electrode plates. A plurality of protrusions are formed on surfaces of the electrode plates.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

Figure 1:
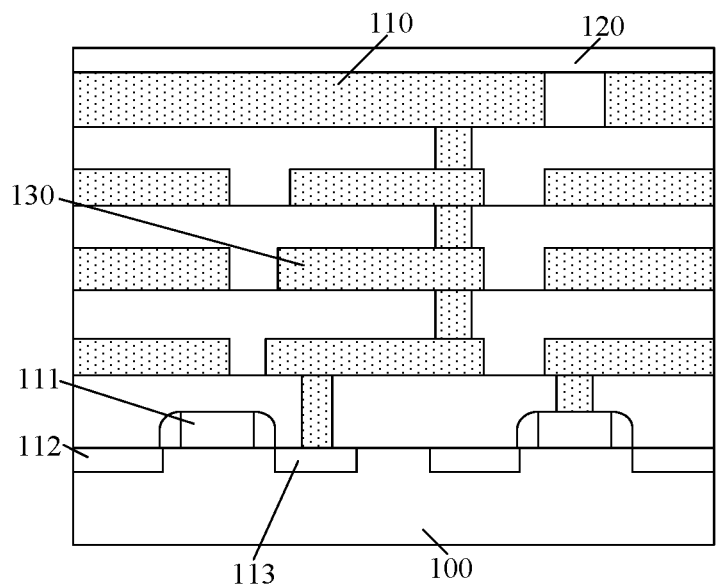
FIG. 1 illustrates a schematic structural view of a fingerprint sensor.

FIG. 1 illustrates a schematic structural view of a fingerprint sensor. Referring to FIG. 1, the fingerprint sensor includes a substrate 100, a plurality of gate structures 111 formed on the substrate 100, a plurality of source regions 112 and a plurality of drain regions 113 formed in the substrate 100 on sides of each gate structure 111, a sensing connection structure 130 connected to the plurality of drain regions 113, an electrode layer 110 connected to the sensing connection structure 130, and a dielectric structure 120 formed on the electrode layer 110.

During the operation of the fingerprint sensor, when a finger touches the dielectric structure 120, the finger, the dielectric structure 120, and the electrode layer 110 together form a plurality of capacitors. The capacitance of the capacitors formed at the valleys of the fingerprint is small due to the large distance between the valleys of the fingerprint and the surface of the electrode layer 110. The capacitance of the capacitors formed at the ridges of the fingerprint is large due to the small distance between the ridges of the fingerprint and the surface of the electrode layer 110. Therefore, the fingerprint sensor is able to acquire the fingerprint by measuring the capacitance values.

However, the difference in the distance to the electrode layer 110 may be small at the ridges of the fingerprints as compare to at the valleys of the fingerprints. Therefore, the difference in the capacitance at the ridges as compared to at the valleys may also be small, and thus the sensitivity of the fingerprint sensor may be poor. In addition, when the thickness of the dielectric structure 120 is too small, the dielectric structure 120 may not be able to provide sufficient protection for the electrode layer 110. Therefore, the thickness of the dielectric structure 120 may be hardly reduced, and thus the capacitance value of the capacitor may be small, and the sensitivity for the fingerprint sensor may be poor.

Figure 7:
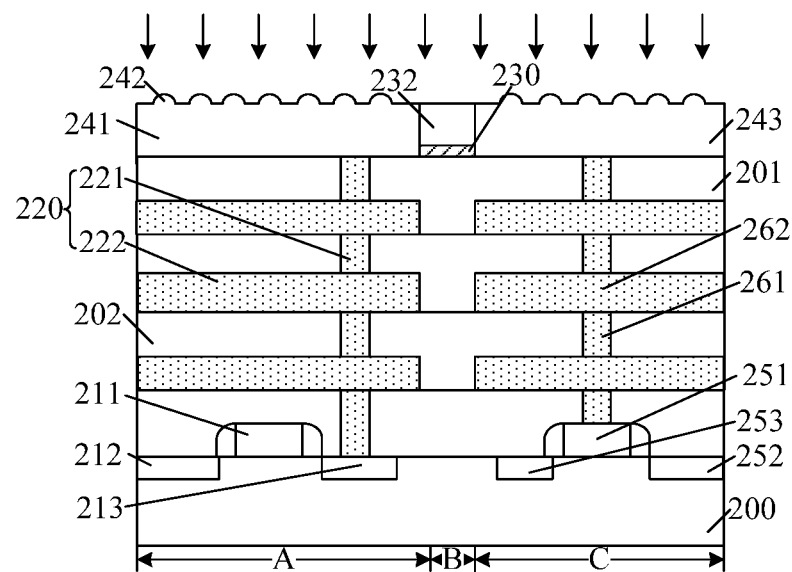
Figure 8:
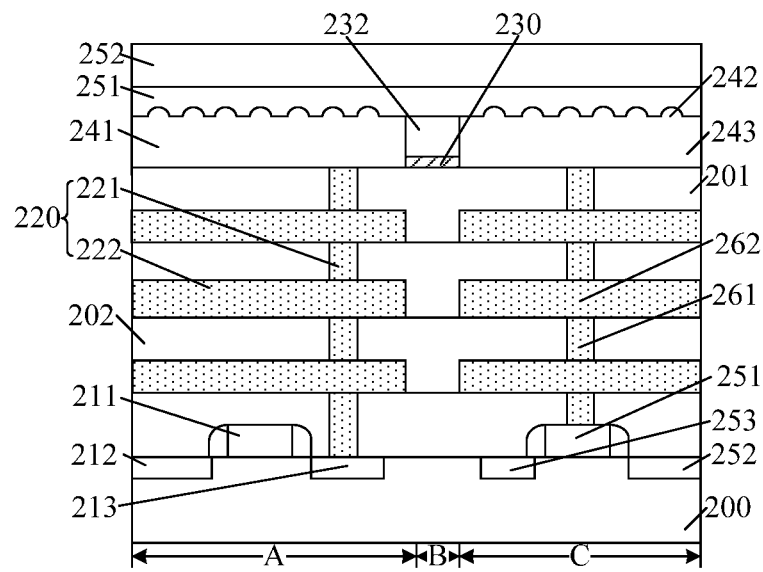
Figure 9:
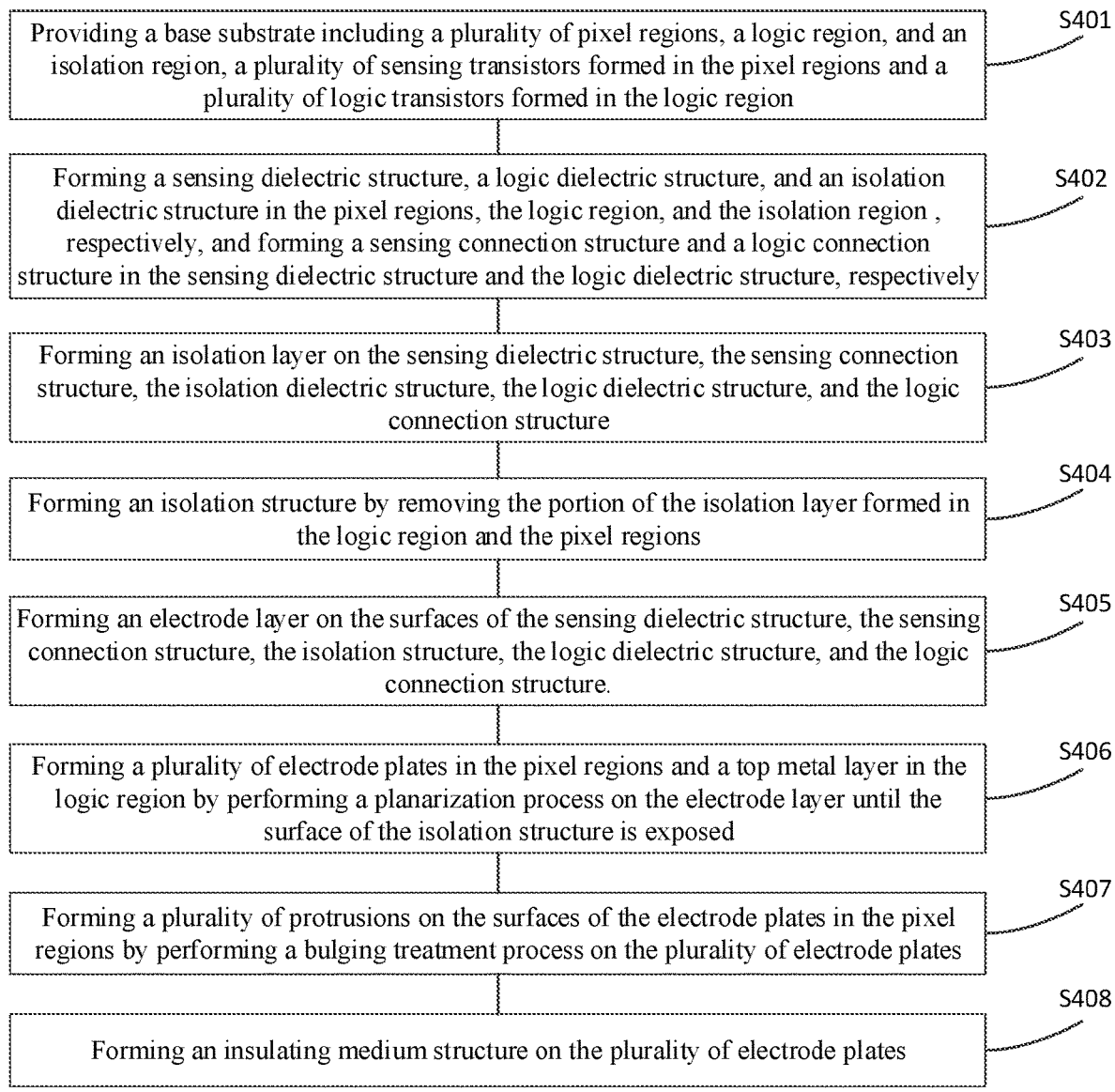
FIG. 9 illustrates a flowchart of an exemplary method for fabricating a semiconductor device consistent with various embodiments of the present disclosure.

The present disclosure provides fingerprint sensors and methods for fabricating the fingerprint sensors. FIG. 9 illustrates a flowchart of an exemplary method for fabricating a semiconductor device consistent with various embodiments of the present disclosure. FIGS. 2-8 illustrate schematic views of semiconductor structures at certain stages of the exemplary fabrication method.

Figure 2:
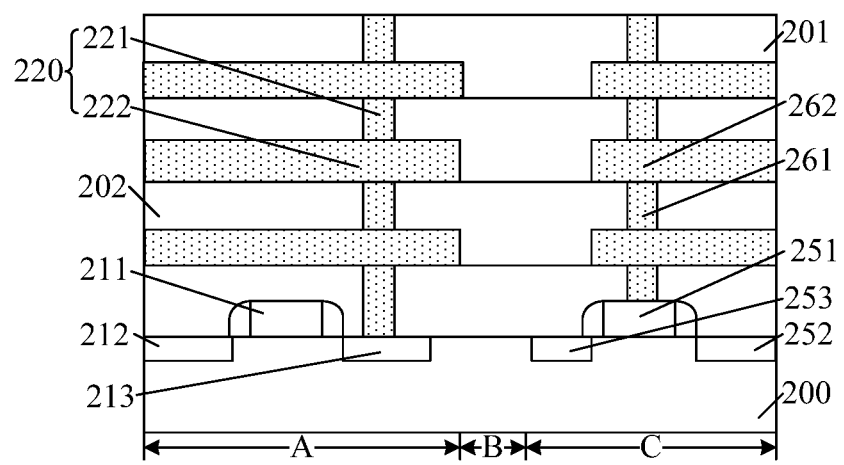
FIGS. 2-8 illustrate schematic views of semiconductor structures at certain stages of an exemplary method for fabricating a fingerprint sensor consistent with various embodiments of the present disclosure.

Referring to FIG. 9, at the beginning of the fabrication process, a base substrate including a plurality of pixel regions, a logic region, and an isolation region may be provided, a plurality of sensing transistors are formed in the plurality of pixel regions, and a plurality of logic transistors are formed in the logic region (S401). FIG. 2 illustrates a schematic view of a semiconductor structure consistent with some embodiments of the present disclosure.

Referring to FIG. 2, a base substrate may be provided. The base substrate may include a plurality of pixel regions A. The plurality of pixel regions A may be used to form pixel cells. The pixel cells may be further used to convert the fingerprint signals into electric signals. The plurality of the pixel regions A may be arranged into a matrix.

The base substrate may also include a logic region C, and an isolation region B arranged between each pixel region A and the logic region C and also between neighboring pixel regions A.

The logic region C may be used to process the electric signals of the pixel regions A. The isolation region B may be used to electrically isolate each pixel region A from the logic region C, and also electrically isolate neighboring pixel regions A.

The base substrate may include a substrate 200, a plurality of sensing transistors formed in the pixel regions A of the substrate 200, and a plurality of logic transistors formed in the substrate 200 of the logic region C.

The sensing transistors may be used to convert the fingerprint information into electric signals, and the logic transistors may be used to process the electrical signals.

Each sensing transistor may include a sensing gate structure 211 formed on the substrate 200 of the pixel region A, and a sensing source region 212 and a sensing drain region 213 formed in the substrate 200 on the sides of the sensing gate structure 211, respectively.

Each logic transistor may include a logic gate structure 251 formed on the substrate 200 of the logic region C, and a logic source region 252 and a logic drain region 253 formed in the substrate 200 on the two sides of the logic gate structure 251, respectively.

Further, returning to FIG. 9, a sensing dielectric structure, a logic dielectric structure, and an isolation dielectric structure may be formed in the pixel regions, the logic region, and the isolation region, respectively, and a sensing connection structure and a logic connection structure may be formed in the sensing dielectric structure and the logic dielectric structure, respectively (S402). The semiconductor structure shown in FIG. 2 includes a sensing dielectric structure formed in the pixel regions of the base substrate.

Returning to FIG. 2, a sensing dielectric structure (not labeled) may be formed on the base substrate in the plurality of pixel regions A. A sensing connection structure 220 may be formed in the sensing dielectric structure. The sensing dielectric structure may expose the sensing connection structure 220, and the sensing connection structure 220 may be connected to the base substrate.

The sensing connection structure 220 may be used to electrically connect the plurality of sensing transistors to a plurality of subsequently-formed electrode plates. The sensing dielectric structure may be used to electrically isolate the sensing connection structure 220 from the external circuits.

For example, the sensing connection structure 220 may be connected to the plurality of sensing drain regions 213 of the sensing transistors.

The fabrication method may also include forming a logic dielectric structure (not labeled) on the base substrate in the logic region C, and a logic connection structure (not labeled) in the logic dielectric structure. The logic dielectric structure may expose the logic connection structure, and the logic connection structure may be connected to the base substrate in the logic region C. The logic connection structure may be connected to the logic gate structure 251.

The sensing dielectric structure may include a plurality of sensing dielectric layers 202 stacked on top of each other on the base substrate in the plurality of pixel regions A.

The sensing connection structure 220 may include a plurality of sensing plugs 221 and a plurality of sensing connection lines 222 alternately arranged in multiple layers. The plurality of sensing plugs 221 may be formed in the sensing dielectric layer 202 and through the sensing dielectric layer 202. Each sensing connection line 222 may be formed to connect the corresponding sensing plug(s) 221, as shown in FIG. 2. The sensing connection structure may expose the top surface of the sensing plug 221 formed in the top layer.

The logic dielectric structure may include a plurality of logic dielectric layers 201 stacked on top of each other on the base substrate in the plurality of pixel regions A.

The logic connection structure may include a plurality of logic plugs 261 and a plurality of logic connection lines 262 alternately arranged in multiple layers. The plurality of logic plugs 261 may be formed in the logic dielectric layer 201 and through the logic dielectric layer 201. Each logic connection line 262 may be formed to connect the corresponding logic plug(s) 261, as shown in FIG. 2. The logic connection structure may expose the top surface of the logic plug 261 formed in the top layer.

The fabrication method may also include forming an isolation dielectric structure (not labeled) on the base substrate in the isolation region B.

The isolation dielectric structure may be used to electrically isolate the logic connection structure from the sensing connection structure 220. The isolation dielectric structure may include a plurality of isolation dielectric layers stacked on top of each other.

In one embodiment, the sensing connection structure 220, the sensing dielectric structure, the logic connection structure, the logic dielectric structure, and the isolation dielectric structure may be formed by a process including the following exemplary steps. A logic dielectric layer 201 may be formed on the base substrate in the logic region C, an isolation dielectric layer may be formed on the base substrate in the isolation region B, and a sensing dielectric layer 202 may be formed on the substrate in the pixel regions A. A logic plug 261 may be formed in the logic dielectric layer 201, and a sensing plug 221 may be formed in the sensing dielectric layer 202. Further, a logic connection line 262 may be formed on the logic plug 261 and the logic dielectric layer 201, and a sensing connection line 222 may be formed on the sensing plug 221 and the sensing dielectric layer 202. The fabrication steps described above may be repeated multiple times until the sensing connection structure 220, the sensing dielectric structure, the logic connection structure, the logic dielectric structure, and the isolation dielectric structure are formed.

The logic connection line 262, the sensing connection line 222, the logic plug 261, and the sensing plug 221 may be made of Al and/or W. The process for forming logic connection line 262, the sensing connection line 222, the logic plug 261, and the sensing plug 221 may include electroplating or organic metal chemical vapor deposition (CVD).

The logic dielectric layer 201, the sensing dielectric layer 202, and the isolation dielectric layer may be made of $SiO_x$. The process for forming the logic dielectric layer 201, the sensing dielectric layer 202, and the isolation dielectric layer may include CVD, physical vapor deposition (PVD), or atomic layer deposition (ALD).

Figure 3:
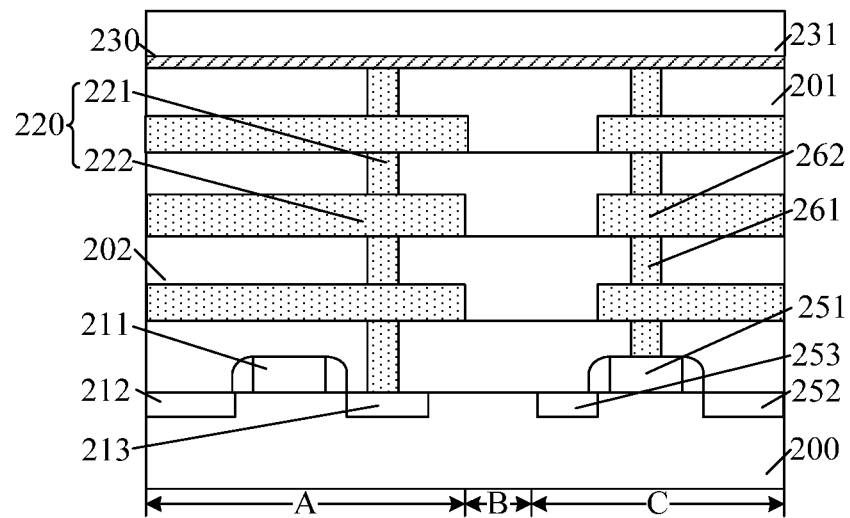

Further, returning to FIG. 9, an isolation layer may be formed on the sensing dielectric structure, the sensing connection structure, the isolation dielectric structure, the logic dielectric structure, and the logic connection structure (S403). FIG. 3 illustrates a schematic cross-section view of a semiconductor structure consistent with some embodiments of the present disclosure.

Referring to FIG. 3, an isolation layer 231 may be formed on the sensing dielectric structure, the sensing connection structure 220, the isolation dielectric structure, the logic dielectric structure, and the logic connection structure.

The isolation layer 231 may be used to form an isolation structure in a subsequent process. In one embodiment, the isolation layer 231 may be made of $SiO_x$ because $SiO_x$ demonstrates desired isolation properties. In other embodiments, the isolation structure may be made of SiON and/or $SiN_x$.

In one embodiment, the process for forming the isolation structure 231 may include CVD, PVD, or ALD.

The thickness of the isolation layer 231 may define the thickness of a plurality of subsequently-formed electrode plates. When the thickness of the isolation layer 231 is too small, the thickness of the subsequently-formed electrode plates may also be too small such that micro-cracks may be easily generated in the electrode plates during a subsequently-performed bulging treatment process, thus affecting the conductivity of the electrode plates. When the thickness of the isolation layer 231 is too large, the fabrication process may be more difficult. In one embodiment, the thickness of the isolation layer 231 is in a range of approximately 2.5 kÅ to 39.5 kÅ.

In one embodiment, the isolation layer 231 and the logic dielectric layer 201 may be made of a same material. In addition, the sensing dielectric layer 202 may also be made of the same material as the isolation layer 231 and the logic dielectric layer 201.

In one embodiment, prior to forming the isolation layer 231, the fabrication process may also include forming a stop layer 230 on the sensing dielectric structure, the sensing connection structure 220, the isolation dielectric structure, the logic connection structure, and the logic dielectric structure. In an etching process subsequently-performed on the isolation layer 231, the stop layer 230 may be used as an indication to stop the etching process.

In other embodiments, the isolation layer and the logic dielectric layer may be made of different materials, and the isolation layer and the sensing dielectric layer may also be made of different materials. In addition, the fabrication process may not include forming a stop layer prior to forming the isolation layer.

In one embodiment, the stop layer 230 may be made of $SiN_x$. In other embodiments, the stop layer may be made of SiON or any other appropriate material(s).

When the thickness of the stop layer 230 is too small, etching on the isolation layer 231 in a subsequent process may not be easily controlled. When the thickness of the stop layer 230 is too large, the fabrication process may be more difficult. In one embodiment, the thickness of the stop layer 230 may be in a range of approximately 450 Å to 550 Å.

Figure 4:
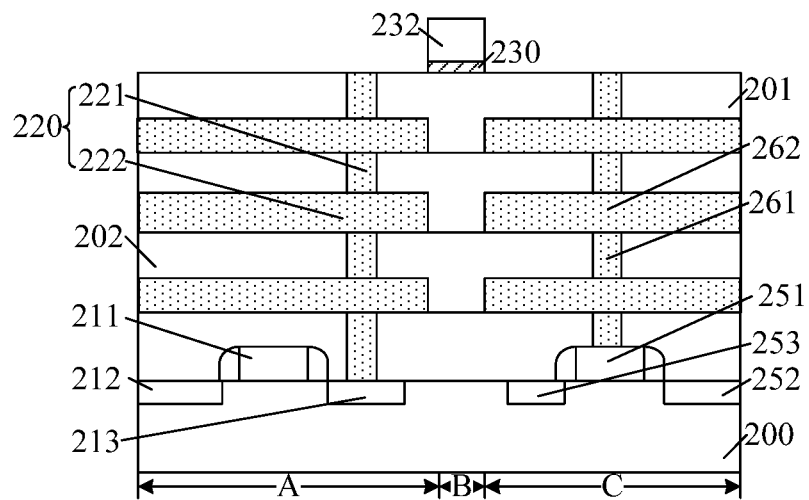

Further, returning to FIG. 9, an isolation structure may be formed by removing the portion of the isolation layer formed in the logic region and the pixel regions (S404). FIG. 4 illustrates a schematic cross-section view of a semiconductor structure consistent with some embodiments of the present disclosure.

Referring to FIG. 4, the portion of the isolation layer 231 (referring to FIG. 3) formed in the logic region C and the plurality of pixel regions A may be removed to form an isolation structure 232 on the isolation region B.

The isolation structure 232 may be used to electrically isolate the electrode plates subsequently-formed in the pixel regions A from the top metal layer subsequently-formed in the logic region C. The isolation structure 232 may also be used to electrically isolate the electrode plates formed in adjacent pixel regions A. Moreover, during a planarization process subsequently-performed on an electrode layer, the isolation structure 232 may also be used to an indication to stop the planarization process.

The isolation structure 232 and the isolation layer 231 (referring to FIG. 3) may be made of a same material. In one embodiment, the isolation structure 232 may be made of $SiO_x$.

The thickness of the isolation structure 232 and the thickness of the isolation layer 231 may be the same. In one embodiment, the thickness of the isolation structure 232 may be in a range of approximately 2.5 kÅ to 39.5 kÅ.

In one embodiment, the portion of the isolation layer 231 formed in the logic region C and the pixel regions A may be removed by a process including dry etching and/or wet etching.

In one embodiment, after removing the portion of the isolation layer 231 formed in the logic region C and the pixel regions A, the fabrication process may also include removing the portion of the stop layer 230 formed in the logic region C and the pixel regions A to expose the sensing connection structure and the logic connection structure. The portion of the stop layer 230 formed in the logic region C and the pixel regions A may be removed by a process including dry etching and/or wet etching.

Figure 5:
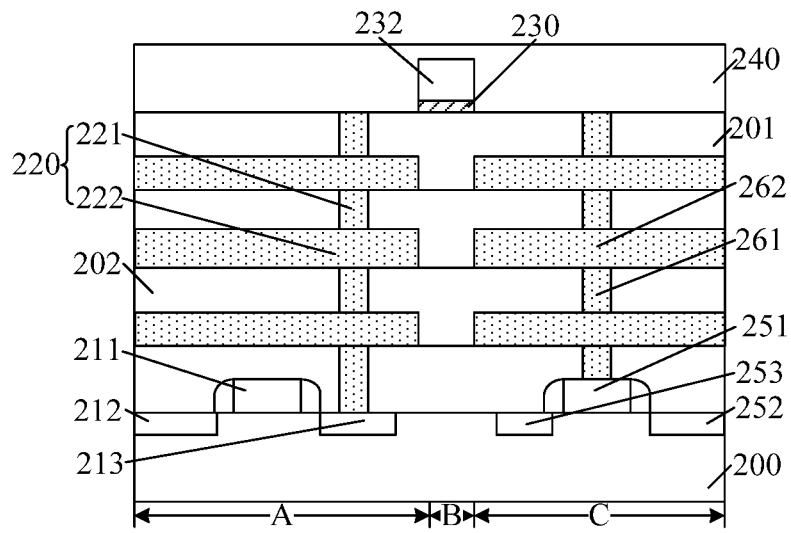

Further, returning to FIG. 9, an electrode layer may be formed on the surfaces of the sensing dielectric structure, the sensing connection structure, the isolation structure, the logic dielectric structure, and the logic connection structure (S405). FIG. 5 illustrates a schematic cross-section view of a semiconductor structure consistent with some embodiments of the present disclosure.

Referring to FIG. 5, an electrode layer 240 may be formed on the surfaces of the sensing dielectric structure, the sensing connection structure 220, the isolation structure 232, the logic dielectric structure, and the logic connection structure.

The electrode layer 240 may be used to form a plurality of electrode plates and a top metal layer in a subsequent process.

In one embodiment, the electrode layer 240 may be made of Cu. The process for forming electrode layer 240 may include electroplating.

Figure 6:
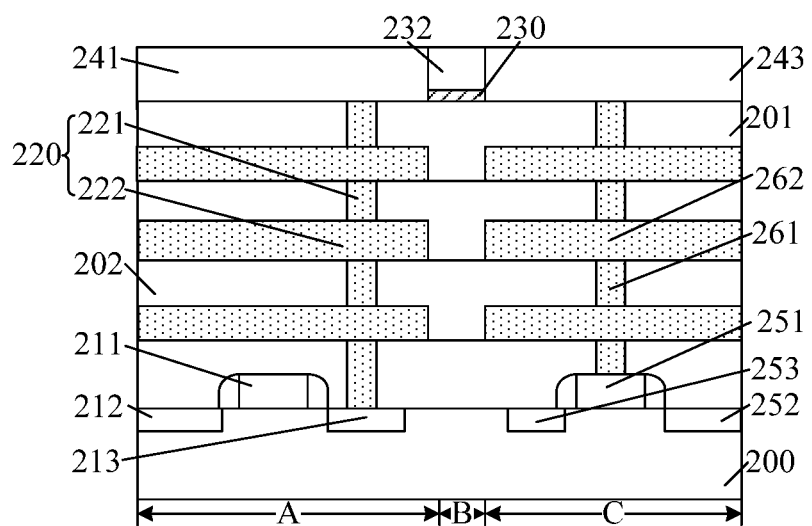

Further, returning to FIG. 9, a planarization process may be performed on the electrode layer until the surface of the isolation structure is exposed such that a plurality of electrode plates may be formed in the pixel regions and a top metal layer may be formed in the logic region (S406). FIG. 6 illustrates a schematic cross-section view of a semiconductor structure consistent with some embodiments of the present disclosure.

Referring to FIG. 6, a planarization process may be performed on the electrode layer 240 (referring to FIG. 5). As the surface of the isolation structure 232 is exposed, based on the electrode layer 240, a plurality of electrode plates 241 may be formed in the pixel regions A and a top metal layer 243 may be formed in the logic region C. That is, after the planarization process, a plurality of electrode plates 241 may be formed on the surfaces of the sensing dielectric structure and the sensing connection structure 220, and a top metal layer 243 may be formed on the surfaces of the logic dielectric structure and the logic connection structure.

The electrode plate 241 may be used as an electrode plate of a corresponding capacitor. The plurality of capacitors may be used to convert the fingerprint information into electrical signals. The top metal layer 243 may be used to electrically connect the logic connection structure to external circuits.

The planarization process may include chemical mechanical polishing (CMP).

During the planarization process, the isolation structure 232 may be used as an indication to stop the planarization process.

The thickness of the electrode plate 241 may be equal to the total thickness of the isolation structure 232 and the stop layer 230. In one embodiment, the thickness of the electrode plate 241 may be in a range of approximately 3 kÅ to 40 kÅ.

Further, returning to FIG. 9, a bulging treatment process may be performed on the plurality of electrode plates to form a plurality of protrusions on the surfaces of the electrode plates (S407). FIG. 7 illustrates a schematic diagram of performing a bulging treatment process for forming protrusions on the electrode plates consistent with some embodiments of the present disclosure.

Referring to FIG. 7, a bulging treatment process may be performed on the plurality of electrode plates 241 to form a plurality of protrusions 242 on the surfaces of the electrode plates 241.

The plurality of protrusions 242 may be able to increase the surface areas of the plurality of electrode plates 241, and thus increasing the capacitance values of the capacitors formed by the electrode plates 241 and the finger. As such, the sensitivity of the fingerprint sensor may be improved.

The bulging treatment process may include introducing a bulging gas to the surfaces of the electrode plates 241, and annealing the electrode plates 241 under the environment of the bulging gas. The bulging gas may be a nitrogen-containing gas.

When annealing the electrode plates 241 under the environment of the bulging gas, the nitrogen atoms in the bulging gas and the copper atoms in the electrode plates 241 may together form Cu—N bonds such that stress may be generated in the electrode plates 241. The copper atoms in the plurality of electrode plates 241 may diffuse toward the surfaces of the electrode plates 241 under the stress, and thus accumulate on the surfaces of the plurality of electrode plates 241, forming protrusions 242. Therefore, the surface areas of the plurality of electrode plates 241 may be increased.

The bulging gas may include at least one of ammonia and nitrogen. In one embodiment, the bulging gas is ammonia. In other embodiments, the bulging gas may further include tetramethylsilane.

The process parameters adopted in the bulging treatment process may include a flow rate of ammonia in a range of approximately 180 sccm to 220 sccm, an offset power in a range of approximately 150 W to 500 W, a process time in a range of approximately 15 s to 120 s, and an annealing temperature in a range of approximately 300° C. to 400° C.

In one embodiment, having the flow rate of ammonia in a range of approximately 180 sccm to 220 sccm is due to the following reasons. When the flow rate of ammonia is too small, the nitrogen atoms and the copper atoms may not easily form Cu—N bonds, which may adversely affect the formation of the plurality of protrusions 242. Moreover, when the flow rate of ammonia is too large, the overly large flow rate may easily cause material waste.

In one embodiment, having the process time in a range of approximately 15 s to 120 s is due to the following reasons. When the process time is too short, the diameter of the formed protrusions 242 may be too small, and thus the surface areas of the electrode plates 241 may not be effectively increased. Moreover, when the process time is too long, the amount of the Cu—N bonds in the electrode plates 241 may be excessively large, thus affecting the conductivity of the electrode plates 241.

In one embodiment, having the annealing temperature in a range of approximately 300° C. to 400° C. is due to the following reasons. When the annealing temperature is too low, the formation of the Cu—N bonds through the reaction between ammonia and the electrode plates 241 may be affected, which may adversely affect the formation of the protrusions 242. Moreover, when the annealing temperature is overly high, the process cost may be increased.

In one embodiment, the bulging treatment process may also lead to formation of a plurality of protrusions 242 on the surface of the top metal layer 243.

In one embodiment, each protrusion 242 may be hemispherical.

The radius of the protrusions 242 may be small. For example, the radius of the protrusions 242 may be smaller than the height difference between the ridges and the valleys of the fingerprint. A small radius of the protrusions 242 may not be able to affect the distance from the ridges to the electrode plates 241, and the distance from the valleys to the electrode plates 241. As such, the distance from the valleys to the electrode plates 241 may be larger than the distance from the ridges to the electrode plates 241. Therefore, the plurality of protrusions 242 may not easily affect the difference between the capacitor values at the ridges and at the valleys of the fingerprint. As such, the fingerprint sensor may have high accuracy.

When the radius of the protrusions 242 is too small, the small radius may not conducive to increasing the surface areas of the electrode plates 241. When the radius of the protrusions 242 is too large, the amount of the Cu—N bonds in the electrode plates 241 may be large, which may reduce the conductivity of the electrode plates 241. In one embodiment, the radius of the protrusions 242 may be in a range of approximately 100 Å to 200 Å.

When the distance between neighboring protrusions 242 is too large, the number of protrusions 242 formed on the surface of the electrode plates 241 may be small, which may not be conducive to increasing the surface areas of the electrode plates 241, and thus the sensitivity of the formed fingerprint sensor may not be improved. When the distance between neighboring protrusions 242 is too small, the amount of the Cu—N bonds in the electrode plates 241 may be large, and thus the electrode plates 241 may contain excessive amount of the Cu—N bonds, which may easily reduce the conductivity of the electrode plates 241. In one embodiment, the distance between neighboring protrusions 242 may be in a range of approximately 100 Å to 5000 Å.

Further, returning to FIG. 9, an insulation medium structure may be formed on the electrode plates (S408). FIG. 8 illustrates a schematic cross-section view of a semiconductor structure consistent with some embodiments of the present disclosure.

Referring to FIG. 8, after performing the bulging treatment process, an insulation medium structure, including a passivation layer and a protective layer, may be formed on the plurality of electrode plates 241.

The insulation medium structure may be used to isolate the plurality of electrode plates 241 from the external environment. During the operation of the formed fingerprint sensor, the finger and the electrode plates 241 may be isolated from each other by the insulation medium structure such that the finger, the plurality of electrode plates 241 and the insulation medium structure may together form a plurality of capacitors. By measuring the capacitance values of the capacitors, the fingerprint sensor may be able to convert the fingerprint information into electric signals.

In addition, because a plurality of protrusions 242 may be formed on the surfaces of the electrode plates 241, the contact areas between the electrode plates 241 and the insulation medium structure may be increased such that the capacitance values of the capacitors may be increased. Therefore, the sensitivity of the formed fingerprint sensor may be further improved.

The insulation medium structure may include a passivation layer 251 formed on the electrode plates 241, and a protective layer 252 formed on the passivation layer 251.

In one embodiment, the passivation layer 251 may also be formed on the isolation structure 232 and the top metal layer 243. The passivation layer 251 may be made of a material including at least one of $SiO_x$ and $SiN_x$. The protective layer 252 may be made of polyimide.

Further, the present disclosure also provides a fingerprint sensor. FIG. 8 illustrates an exemplary fingerprint sensor consistent with some embodiments of the present disclosure.

Referring to FIG. 8, the fingerprint sensor may include a base substrate including a plurality of pixel regions A, a sensing dielectric structure formed on the base substrate in the pixel regions A, and a sensing connection structure 220 formed in the sensing dielectric structure. The sensing dielectric structure may expose the sensing connection structure 220, and the sensing connection structure 220 may be connected to the base substrate. The fingerprint sensor may also include a sensing dielectric structure and a plurality of electrode plates 241 formed on the surface of the sensing connection structure 220. A plurality of protrusions 242 may be formed on the surfaces of the plurality of electrode plates 241. The fingerprint sensor may also include an insulation medium structure formed on the plurality of electrode plates 241.

In one embodiment, the base substrate may include a plurality of pixel regions A. The base substrate may also include a logic region C, and an isolation region B arranged between each pixel region A and the logic region C and also between neighboring pixel regions A.

The logic region C may be used to process the electric signals of the pixel regions A. The isolation region B may be used to electrically isolate each pixel region A from the logic region C, and also electrically isolate neighboring pixel regions A.

The base substrate may include a substrate 200, a plurality of sensing transistors formed in the pixel regions A of the substrate 200, and a plurality of logic transistors formed in the substrate 200 of the logic region C.

The sensing transistors may be used to convert the fingerprint information into electric signals, and the logic transistors may be configured to process the electrical signals.

Each sensing transistor may include a sensing gate structure 211 formed on the substrate 200 of the pixel region A, and a sensing source region 212 and a sensing drain region 213 formed in the substrate 200 on the two sides of the sensing gate structure 211, respectively.

Each logic transistor may include a logic gate structure 251 formed on the substrate 200 of the logic region C, and a logic source region 252 and a logic drain region 253 formed in the substrate 200 on the two sides of the logic gate structure 251, respectively.

The sensing dielectric structure may include a plurality of sensing dielectric layers 202 stacked on top of each other on the base substrate in the plurality of pixel regions A.

The sensing connection structure 220 may include a plurality of sensing plugs 221 and a plurality of sensing connection lines 222 alternately arranged in multiple layers. The plurality of sensing plugs 221 may be formed in the sensing dielectric layer 202 and may penetrate through the sensing dielectric layer 202. The plurality of sensing connection lines 222 may be formed to connect the corresponding sensing plugs 221. The sensing connection structure may expose the top surface of the sensing plug 221 formed in the top layer.

The fingerprint sensor may also include a logic dielectric structure (not labeled) formed on the base substrate in the logic region C. A logic connection structure may be formed in the logic dielectric structure.

The logic dielectric structure may include a plurality of logic dielectric layers 201 stacked on top of each other on the base substrate in the plurality of pixel regions A.

The logic connection structure may include a plurality of logic plugs 261 and a plurality of logic connection lines 262 alternately arranged in multiple layers. The plurality of logic plugs 261 may be formed in the logic dielectric layer 201 and may penetrate through the logic dielectric layer 201. The plurality of logic connection lines 262 may be formed to connect the corresponding logic plugs 261. The logic connection structure may expose the top surface of the logic plug 261 formed in the top layer.

The fingerprint sensor may also include an isolation dielectric structure (not labeled) formed on the base substrate in the isolation region B, an isolation structure 232 formed on the isolation dielectric structure, and a stop layer 230 formed between the isolation structure 232 and the isolation dielectric structure.

In one embodiment, the plurality of electrode plates 241 may be made of Cu. The thickness of the electrode plates 241 may be in a range of approximately 3 kÅ to 40 kÅ.

The insulation medium structure may include a passivation layer 251 formed on the electrode plates 241, and a protective layer 252 formed on the passivation layer 251.

In one embodiment, the passivation layer 251 may be made of a material including at least one of $SiO_x$ and $SiN_x$. The protective layer 252 may be made of polyimide.

In one embodiment, each protrusion 242 may be hemispherical. The radius of the protrusions 242 may be in a range of approximately 100 Å to 200 Å.

Compared to conventional fingerprint sensors and fabrication methods, the disclosed fingerprint sensors and fabrication methods may demonstrate advantages.

According to the disclosed method for fabricating fingerprint sensors, a plurality of protrusions are formed on the surfaces of the electrode plates through a bulging treatment process. During the operation of the fingerprint sensor, when a finger touches the insulation medium structure, the finger, the insulation medium structure, and the electrode plates together form a plurality of capacitors. The plurality of protrusions increase the surface areas of the electrode plates such that the capacitance of the capacitors are increased. Therefore, the sensitivity of the fingerprint sensor may be improved.

Further, the plurality of protrusions are hemispherical, and the radiuses of the protrusions are in a range of approximately 100 Å to 200 Å. The radiuses of the protrusions are relatively small. For example, the radius of each protrusion is smaller than the height difference between the valleys of the fingerprint and the ridges of the fingerprint. Small radiuses of the protrusions may unlikely affect the distances between the ridges of the fingerprint and the corresponding electrode plates and may also unlikely affect the distances between the valleys of the fingerprint and the corresponding electrode plates. Therefore, small radiuses of the protrusions may be able to ensure the distance from a ridge of the fingerprint to the corresponding electrode plate larger than the distance from a valley of the fingerprint to the corresponding electrode plate. As such, the difference in the capacitance values between a capacitor at a ridge of the fingerprint and a capacitor at a valley of the fingerprint may not be affected by the plurality of protrusions. Thus, the fingerprint sensor may be able to have high sensitivity.

According to the disclosed fingerprint sensor, during the operation of the fingerprint sensor, when a finger touches the insulation medium structure, the finger, the insulation medium structure, and the electrode plates together form a plurality of capacitors. The plurality of protrusions increase the surface areas of the electrode plates such that the capacitance of the capacitors are increased. Therefore, the sensitivity of the fingerprint sensor may be improved.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A fingerprint sensor, comprising:
 a base substrate including a plurality of pixel regions;
 a sensing dielectric structure formed on the base substrate in the pixel regions;
 a sensing connection structure formed in the sensing dielectric structure, wherein the sensing dielectric structure exposes the sensing connection structure, and the sensing connection structure is connected to the base substrate;
 a plurality of electrode plates formed on surfaces of the sensing dielectric structure and the sensing connection structure, wherein a plurality of protrusions are formed on surfaces of the electrode plates; and
 an insulation medium structure formed on the plurality of electrode plates.

2. The fingerprint sensor according to claim 1, wherein:
 the plurality of electrode plates are made of copper.

3. The fingerprint sensor according to claim 1, wherein:
 the insulation medium structure includes a passivation layer formed on the plurality of electrode plates, and a protective layer formed on the passivation layer, wherein:
 the passivation layer is made of a material including at least one of $SiO_x$ and $SiN_x$; and
 the protective layer is made of a material including polyimide.

4. The fingerprint sensor according to claim 1, wherein:
 the plurality of protrusions are hemispherical with a radius in a range of approximately 100 Å to 200 Å.

5. The fingerprint sensor according to claim 1, wherein the base substrate further includes:
 a logic region; and
 an isolation region separating the logic region from the plurality of pixel regions and also separating adjacent pixel regions, wherein:
 a logic dielectric structure is formed on the base substrate in the logic region,
 a logic connection structure is formed in the logic dielectric layer, and
 an isolation dielectric structure is formed on the base substrate in the isolation region, and
 an isolation structure is formed on the isolation dielectric structure in the isolation region.

6. The fingerprint sensor according to claim 5, wherein the isolation structure is formed by:
 forming an isolation layer on the sensing dielectric structure, the sensing connection structure, the isolation dielectric structure, the logic dielectric structure, and the logic connection structure; and
 removing a portion of the isolation layer formed in the logic region and the pixel regions to form the isolation structure.

7. The fingerprint sensor according to claim 6, further including:
 a top metal layer formed on surfaces of the logic dielectric structure and the logic connection structure,
 wherein forming the plurality of electrode plates and the top metal layer includes:
 forming an electrode layer on the surfaces of the sensing dielectric structure, the sensing connection structure, the isolation structure, the logic dielectric structure, and the logic connection structure; and
 removing a portion of the electrode layer formed on the isolation structure through a planarization process for forming the plurality of electrode plates in the pixel regions and the top metal layer in the logic region.

8. The fingerprint sensor according to claim 7, wherein:
 the electrode layer is formed by an electroplating process.

9. The fingerprint sensor according to claim 7, further including:
 a stop layer formed on the sensing dielectric structure.

10. The fingerprint sensor according to claim 9, wherein:
 the isolation structure is made of $SiO_x$; and
 the stop layer is made of $SiN_x$.

11. The fingerprint sensor according to claim 1, wherein:
a distance between neighboring protrusions is in a range of approximately 100 Å to 5000 Å.

\* \* \* \* \*